US011923363B2

(12) United States Patent
Frougier et al.

(10) Patent No.: US 11,923,363 B2
(45) Date of Patent: Mar. 5, 2024

(54) SEMICONDUCTOR STRUCTURE HAVING BOTTOM ISOLATION AND ENHANCED CARRIER MOBILITY

(71) Applicant: International Business Machines Corporation, Armonk, NY (US)

(72) Inventors: Julien Frougier, Albany, NY (US); Ruilong Xie, Niskayuna, NY (US); Kangguo Cheng, Schenectady, NY (US); Chanro Park, Clifton Park, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 17/480,063

(22) Filed: Sep. 20, 2021

(65) Prior Publication Data
US 2023/0086633 A1     Mar. 23, 2023

(51) Int. Cl.
*H01L 27/092* (2006.01)
*H01L 21/8238* (2006.01)
(Continued)

(52) U.S. Cl.
CPC .... *H01L 27/092* (2013.01); *H01L 21/823814* (2013.01); *H01L 21/823878* (2013.01);
(Continued)

(58) Field of Classification Search
CPC ........... H01L 27/092; H01L 21/823814; H01L 21/823878; H01L 29/0665;
(Continued)

(56) References Cited

U.S. PATENT DOCUMENTS 5,972,758 A    10/1999   Liang
7,598,178 B2   10/2009   Samoilov et al.
(Continued)

FOREIGN PATENT DOCUMENTS

CN    102986022 A    3/2013
CN    103270597 B    6/2016
(Continued)

OTHER PUBLICATIONS

International Search Report and Written Opinion of PCT/CN2022/103664, dated Oct. 10, 2022, 10 pages.
(Continued)

*Primary Examiner* — Joe E. Schoenholtz
(74) *Attorney, Agent, or Firm* — Samuel Waldbaum; Ryan, Mason & Lewis, LLP

(57) ABSTRACT

Illustrative embodiments provide techniques for fabricating semiconductor structures having bottom isolation and enhanced carrier mobility for both nFET and pFET devices. For example, in one illustrative embodiment, a semiconductor structure includes a semiconductor substrate, a first dielectric layer disposed on the semiconductor substrate, a bottom source/drain region disposed on the first dielectric layer and isolated from the semiconductor substrate by the first dielectric layer, a second dielectric layer disposed on the bottom source/drain region and a top source/drain region disposed on the second dielectric layer and isolated from the bottom source/drain region by the second dielectric layer. The bottom source/drain region comprises a compressive pFET epitaxy and the top source/drain region comprises a tensile nFET epitaxy.

20 Claims, 13 Drawing Sheets

(51) Int. Cl.
*H01L 29/06* (2006.01)
*H01L 29/423* (2006.01)
*H01L 29/786* (2006.01)

(52) U.S. Cl.
CPC .... *H01L 29/0665* (2013.01); *H01L 29/42392* (2013.01); *H01L 29/78696* (2013.01)

(58) Field of Classification Search
CPC ......... H01L 29/42392; H01L 29/78696; H01L 29/165; H01L 21/8221; H01L 21/823807; H01L 27/0688; H01L 29/0673; H01L 29/66439; H01L 29/66545; H01L 29/775; H01L 29/7848; B82Y 10/00
See application file for complete search history.

(56) References Cited

U.S. PATENT DOCUMENTS

| | | |
|---|---|---|
| 8,901,537 B2 | 12/2014 | Murthy et al. |
| 9,460,958 B2 | 10/2016 | Purayath et al. |
| 9,711,414 B2 | 7/2017 | Hatcher et al. |
| 9,761,722 B1 | 9/2017 | Jagannathan et al. |
| 9,905,643 B1 | 2/2018 | Bergendahl et al. |
| 9,991,261 B2 | 6/2018 | Mitard |
| 10,032,867 B1 | 7/2018 | Yeung et al. |
| 10,170,638 B1 | 1/2019 | Reznicek |
| 10,453,824 B1 | 10/2019 | Mochizuki et al. |
| 10,468,311 B2 | 11/2019 | Reznicek |
| 10,483,353 B2 | 11/2019 | Mohapatra |
| 10,770,047 B2 | 9/2020 | Litovsky et al. |
| 10,867,997 B2 | 12/2020 | Yoon et al. |
| 10,903,316 B2 | 1/2021 | Stamper et al. |
| 11,302,802 B2 | 4/2022 | Wang et al. |
| 2012/0001171 A1 | 1/2012 | Atanackovic |
| 2017/0309719 A1 | 10/2017 | Sun et al. |
| 2018/0358440 A1 | 12/2018 | Mohapatra et al. |
| 2019/0013382 A1* | 1/2019 | Stamper ................. H01L 23/66 |
| 2019/0214482 A1 | 7/2019 | Xie et al. |
| 2019/0229184 A1 | 7/2019 | Shank et al. |
| 2022/0302172 A1* | 9/2022 | Hong .................. H01L 27/1211 |

FOREIGN PATENT DOCUMENTS

| | | |
|---|---|---|
| CN | 106024868 A | 10/2016 |
| CN | 109244033 A | 1/2019 |
| CN | 111699550 A | 9/2020 |
| CN | 113284890 A | 8/2021 |
| DE | 112015007222 T5 | 9/2018 |
| EP | 3127862 B1 | 4/2018 |

OTHER PUBLICATIONS

J. Ryckaert et al., "The Complementary FET (CFET) for CMOS scaling beyond N3," Symposium on VLSI Technology, 2018, pp. 141-142.

J. Zhang et al., "Full Bottom Dielectric Isolation to Enable Stacked Nanosheet Transistor for Low Power and High Performance Applications," International Electron Devices Meeting (IEDM), 2019, 11.6, 4 pages.

* cited by examiner

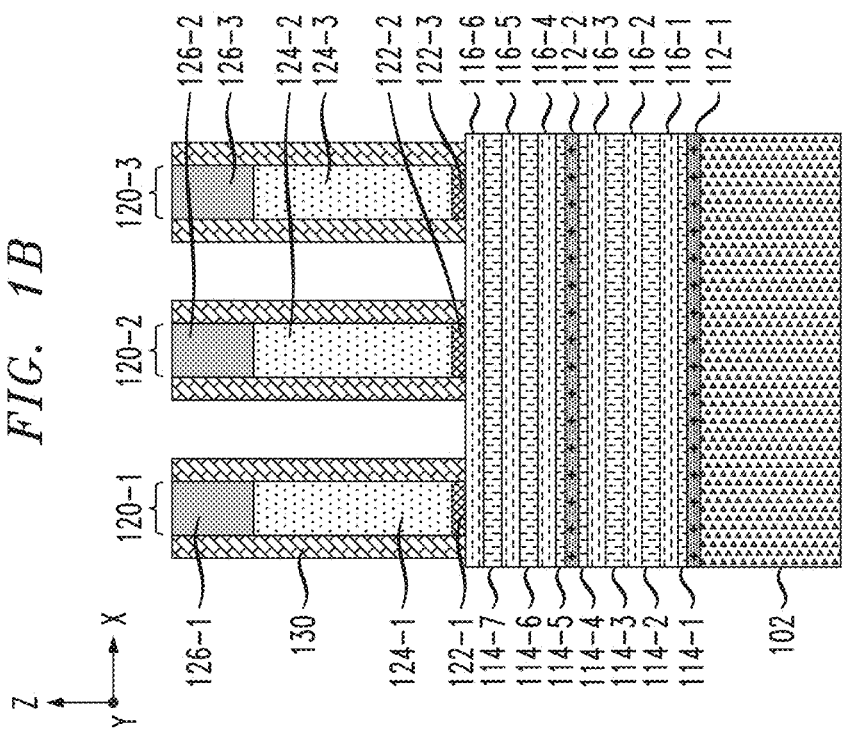
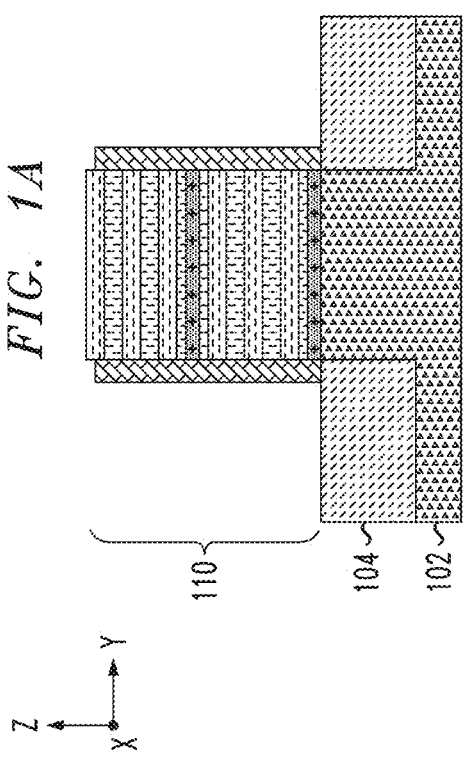
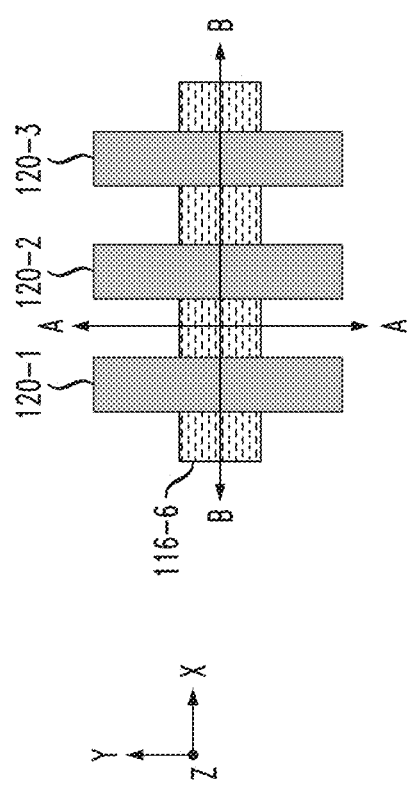

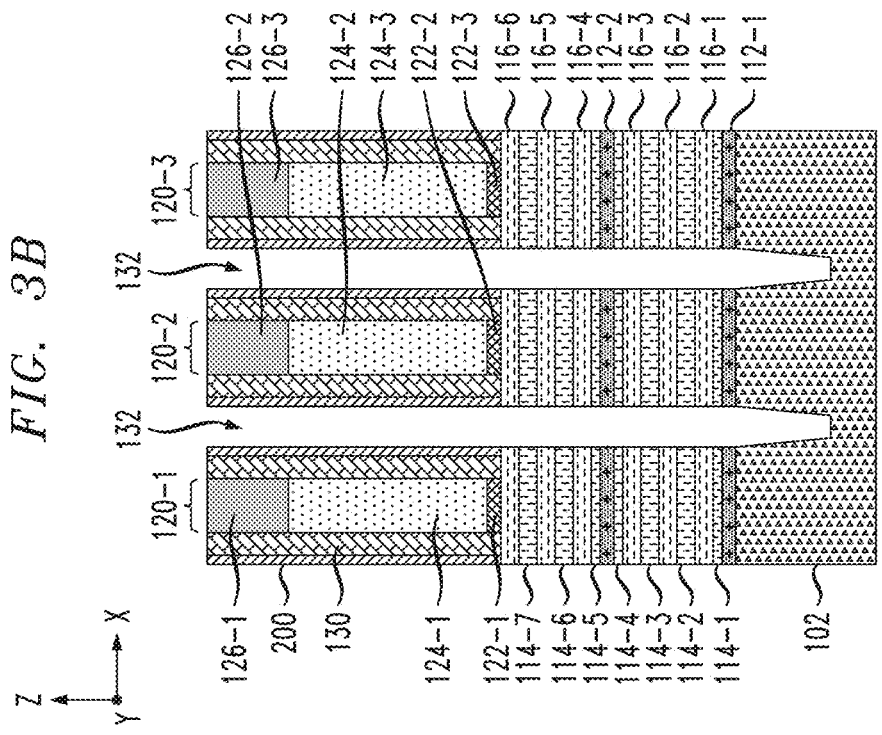
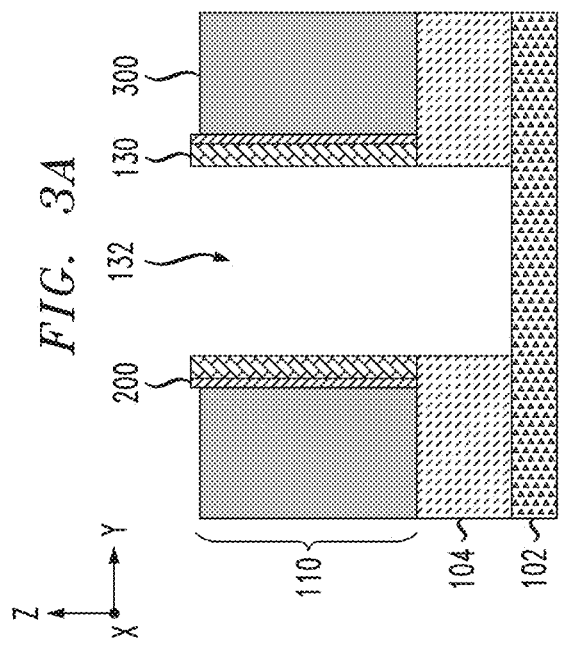

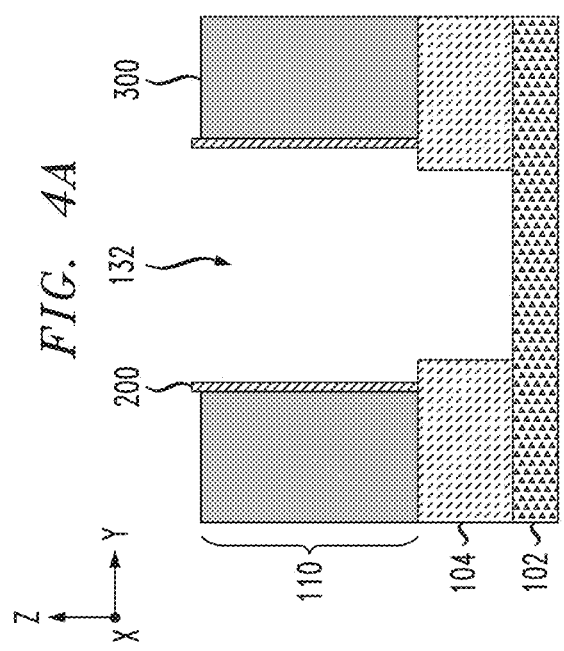
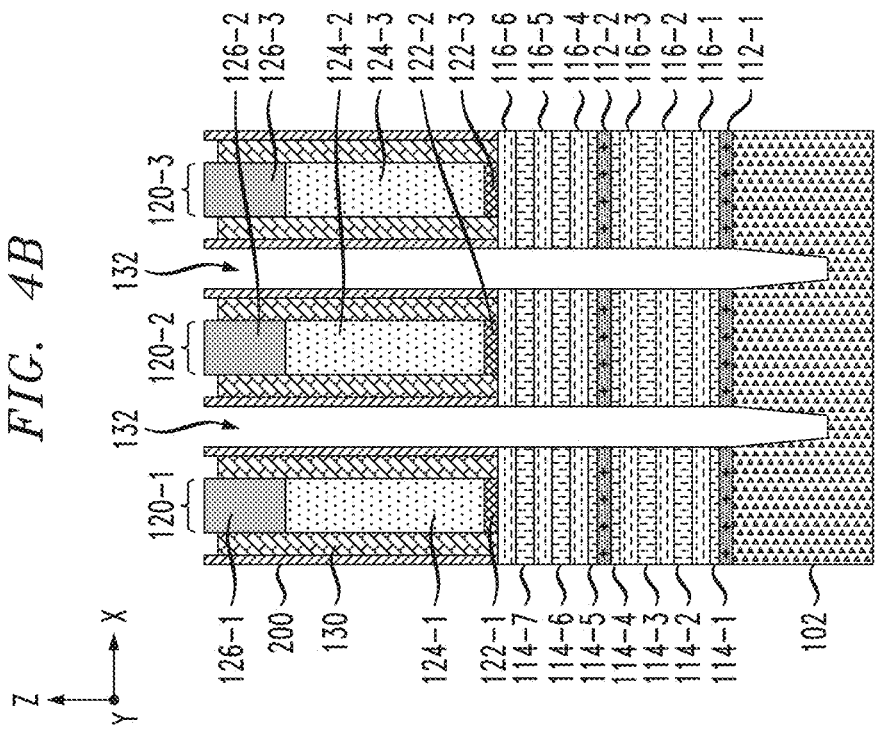

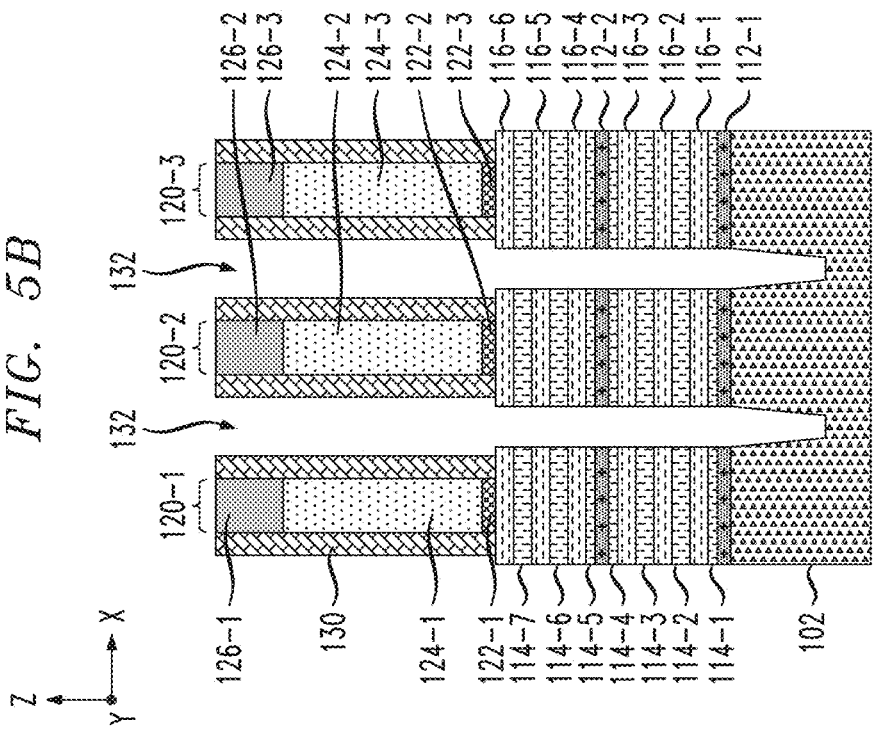
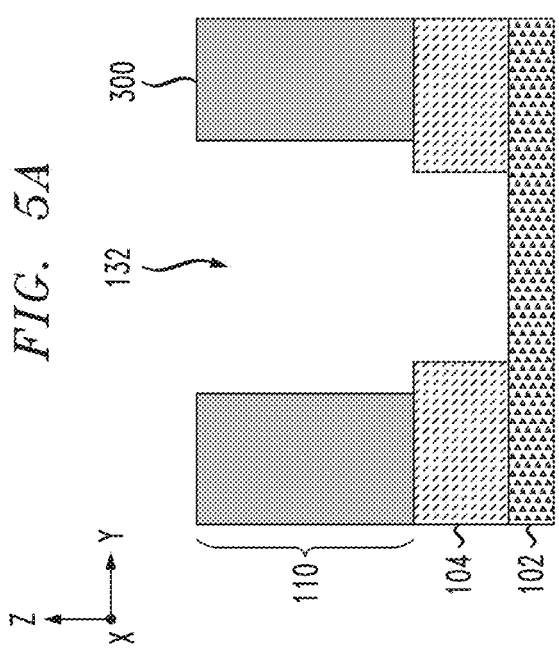
FIG. 5B
FIG. 5A

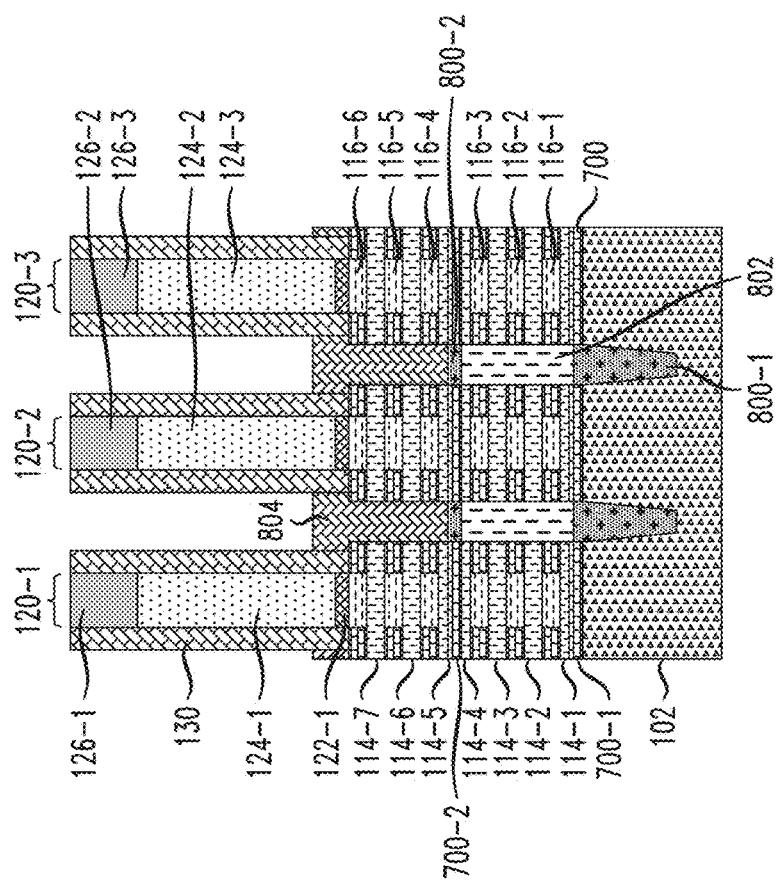
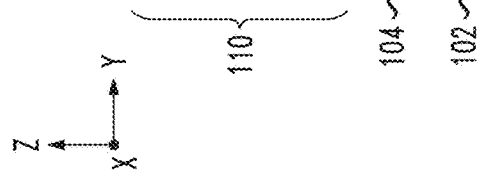
FIG. 8A
FIG. 8B

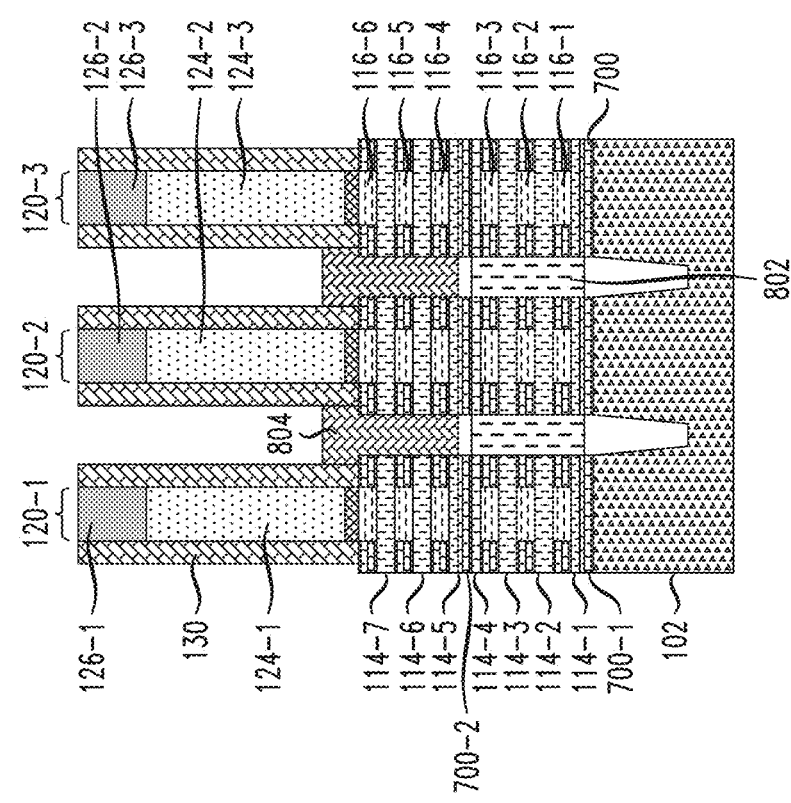
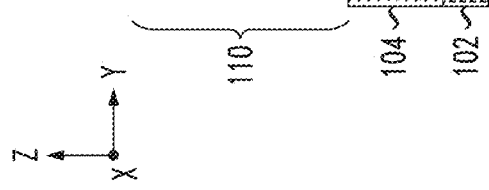
FIG. 9A
FIG. 9B

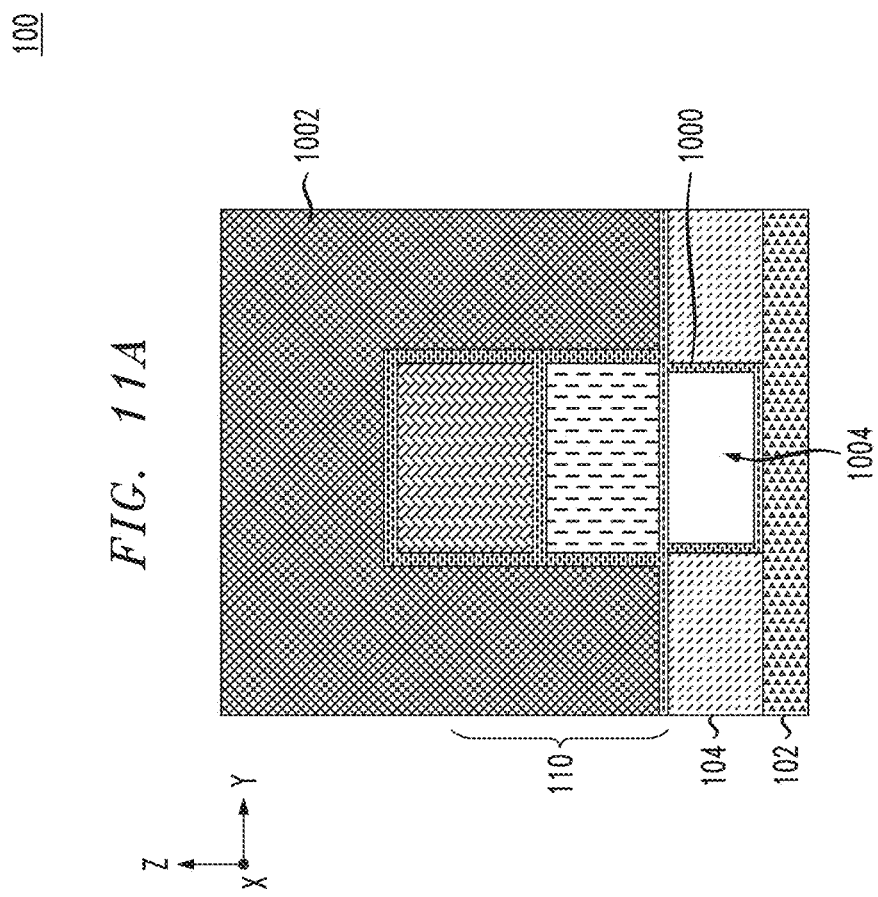

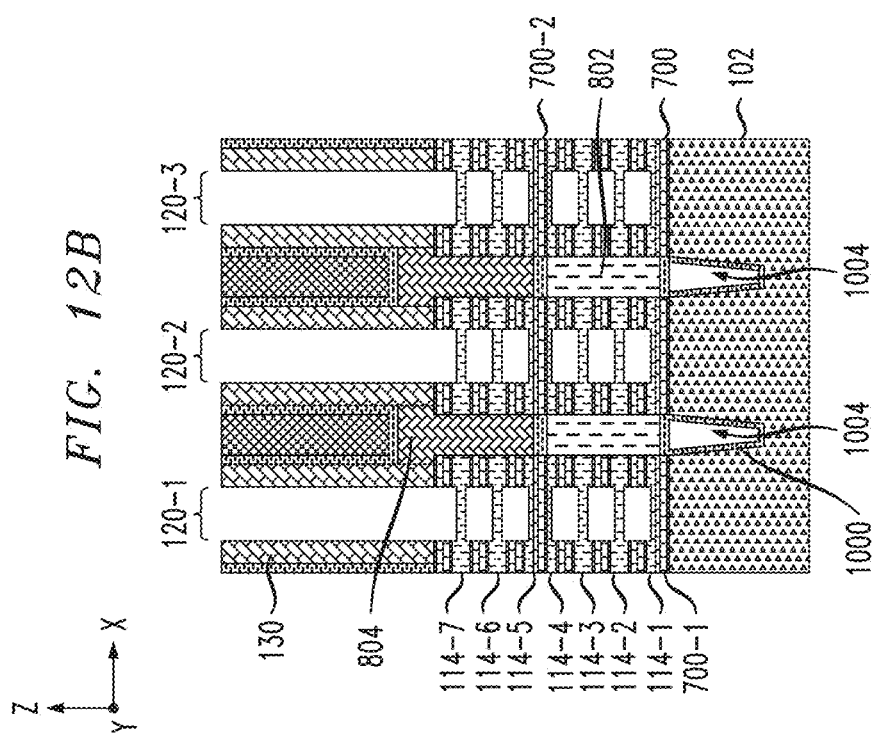
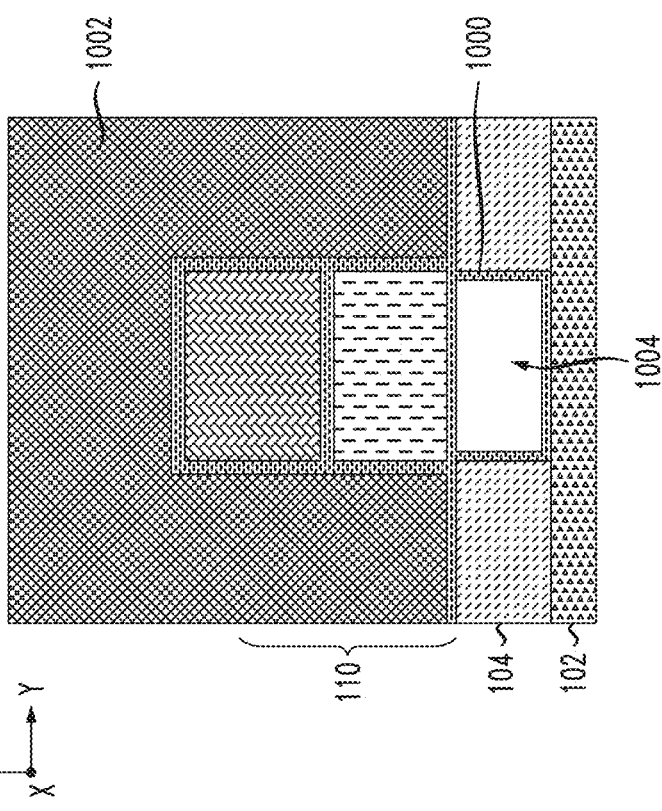

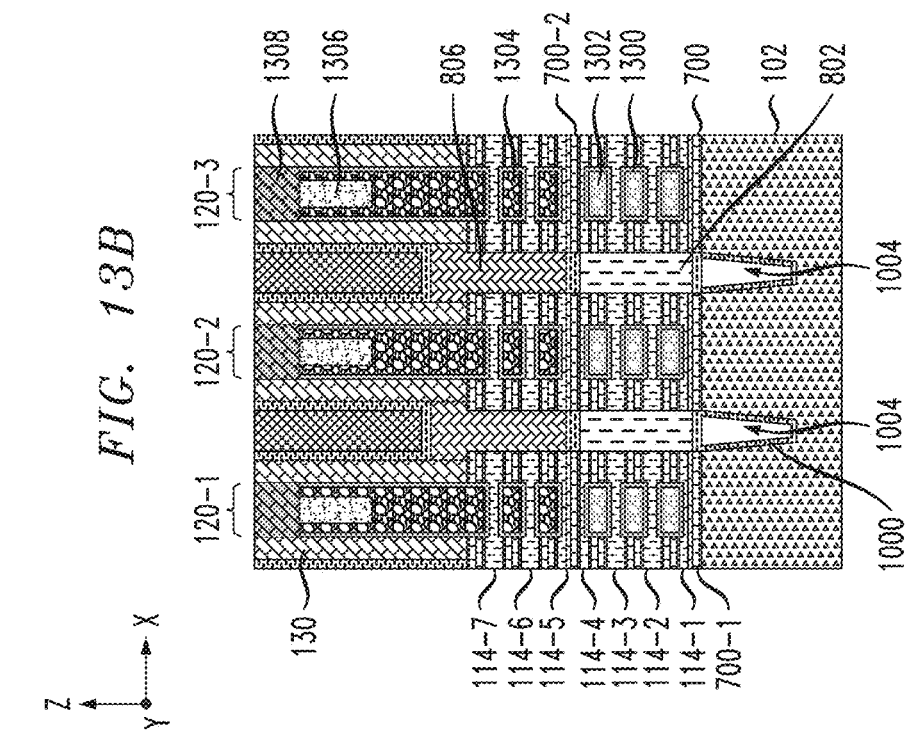
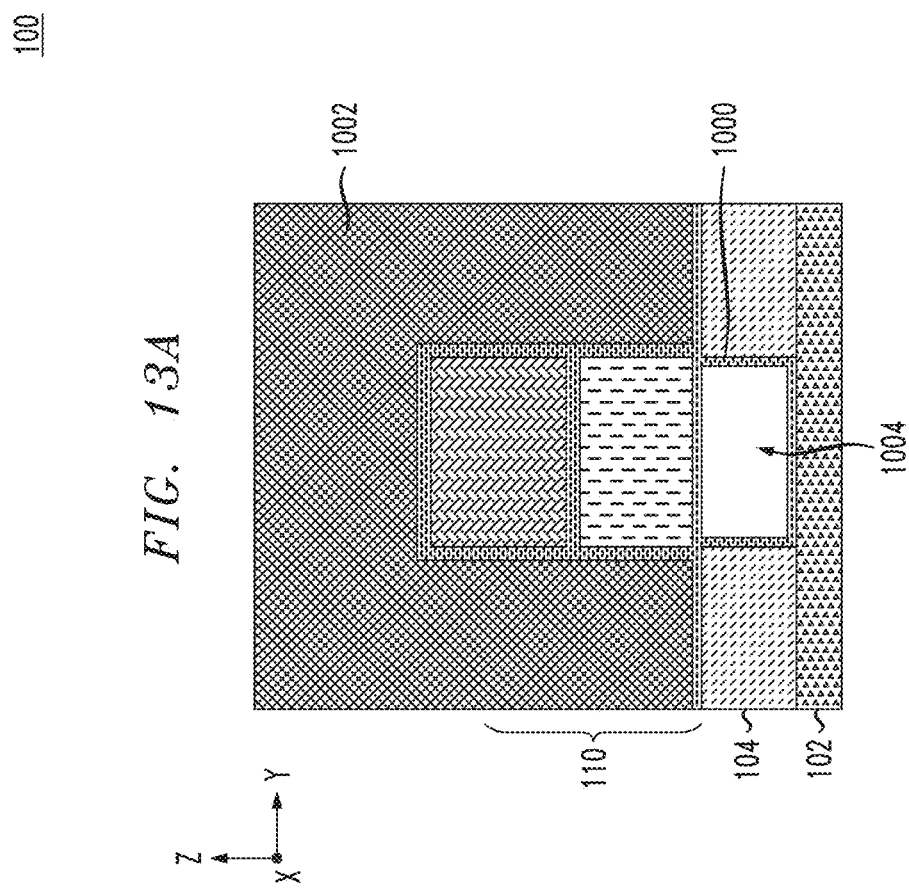
FIG. 13A
FIG. 13B

SEMICONDUCTOR STRUCTURE HAVING BOTTOM ISOLATION AND ENHANCED CARRIER MOBILITY

BACKGROUND

Continued innovations in semiconductor process technologies are enabling higher integration densities and device scaling. As the semiconductor industry moves towards the 7-nm technology node and beyond, semiconductor FET device structures must be scaled to smaller dimensions to provide increased device width per footprint area. In this regard, non-planar FET devices such as nanosheet FET devices, nanowire FET devices, vertical FET devices, FinFET devices, etc., are a viable option for continued CMOS scaling. In general, a nanowire FET device comprises a device channel which comprises one or more nanowire layers in a stacked configuration, wherein each nanowire comprises an elongated semiconductor layer that has a width which is substantially the same or slightly larger than a thickness of the elongated semiconductor layer. A nanosheet FET device is similar to a nanowire FET device sheet in that a device channel comprises one or more nanosheet layers in a stacked configuration, but wherein each nanosheet layer has a width which is substantially greater than a thickness of the nanosheet layer. In nanowire/nanosheet FET devices, a common gate structure is formed above and below each nanowire/nanosheet layer in the stacked configuration, thereby increasing the FET device width (or channel width), and thus the drive current, for a given footprint area.

SUMMARY

Illustrative embodiments provide techniques for fabricating semiconductor structures having bottom isolation and enhanced carrier mobility for both nFET and pFET devices.

For example, in one illustrative embodiment, a semiconductor structure includes a semiconductor substrate, a first dielectric layer disposed on the semiconductor substrate, a bottom source/drain region disposed on the first dielectric layer and isolated from the semiconductor substrate by the first dielectric layer, a second dielectric layer disposed on the bottom source/drain region and a top source/drain region disposed on the second dielectric layer and isolated from the bottom source/drain region by the second dielectric layer.

In some embodiments, the bottom source/drain region comprises a compressive pFET epitaxy and the top source/drain region comprises a tensile nFET epitaxy.

In another illustrative embodiment, a semiconductor structure includes a semiconductor substrate, a dielectric layer disposed on the semiconductor substrate and encapsulating an air gap in the semiconductor substrate and a source/drain region disposed on the dielectric layer above the encapsulated air gap.

In yet another illustrative embodiment, a method for fabricating a semiconductor structure includes etching a channel between a pair of gate structures down into a semiconductor substrate of the semiconductor structure, growing a first sacrificial epitaxial layer in the channel, growing a bottom source/drain region in the channel on the first sacrificial epitaxial layer, growing a second sacrificial epitaxial layer in the channel on the bottom source/drain region, growing a top source/drain region in the channel on the second sacrificial epitaxial layer, removing the first and second sacrificial epitaxial layers, the removal exposing surfaces of the semiconductor substrate, bottom source/drain region and top source/drain region and forming a dielectric layer on the exposed surfaces of the semiconductor substrate, bottom source/drain region and top source/drain region.

Other embodiments will be described in the following detailed description of embodiments, which is to be read in conjunction with the accompanying figures.

BRIEF DESCRIPTION OF THE DRAWINGS

FIGS. 1A-1C are schematic views of a semiconductor structure at an intermediate stage of fabrication, according to an illustrative embodiment.

FIGS. 3A and 3B are schematic views of the semiconductor structure of FIGS. 2A and 2B after the formation of an etch mask and the recessing of the nanosheet stack structure and semiconductor substrate between the gate structures according to the pattern defined by the etch mask, sidewall spacer and sidewall liner to form trenches between the gate structures, according to an illustrative embodiment.

FIGS. 4A and 4B are schematic views of the semiconductor structure of FIGS. 3A and 3B a after removal of the sidewall spacer from the trenches, according to an illustrative embodiment.

FIGS. 5A and 5B are schematic views of the semiconductor structure of FIGS. 4A and 4B after removal of the sidewall liner from the trenches and the gate structures, according to an illustrative embodiment.

FIGS. 8A and 8B are schematic views of the semiconductor structure of FIGS. 7A and 7B after the growth of a first sacrificial epitaxial layer, bottom source/drain regions, second sacrificial epitaxial layer and top source/drain regions in the trenches, according to an illustrative embodiment.

FIGS. 9A and 9B are schematic views of the semiconductor structure of FIGS. 8A and 8B after the removal of first and second sacrificial epitaxial layers, according to an illustrative embodiment.

FIGS. 11A and 11B are schematic views of the semiconductor structure of FIGS. 10A and 10B after the removal of the dummy gate electrodes and the remaining sacrificial nanosheet layers of the gate structures to release the channels of the gate structures, according to an illustrative embodiment.

FIGS. 12A and 12B are schematic views of the semiconductor structure of FIGS. 11A and 11B after the performance of an HKMG pre-clean process and the optional trimming of the nanosheet channel layers, according to an illustrative embodiment.

FIGS. 13A and 13B are schematic views of the semiconductor structure of FIGS. 12A and 12B after the formation of a gate dielectric layer on the exposed surfaces of the gate structures, the formation of a first work function metal (WFM) for the bottom source/drain regions, second WFM for the top source/drain regions, gate contacts and sacrificial gate caps, according to an illustrative embodiment.

DETAILED DESCRIPTION

Figure 2B:
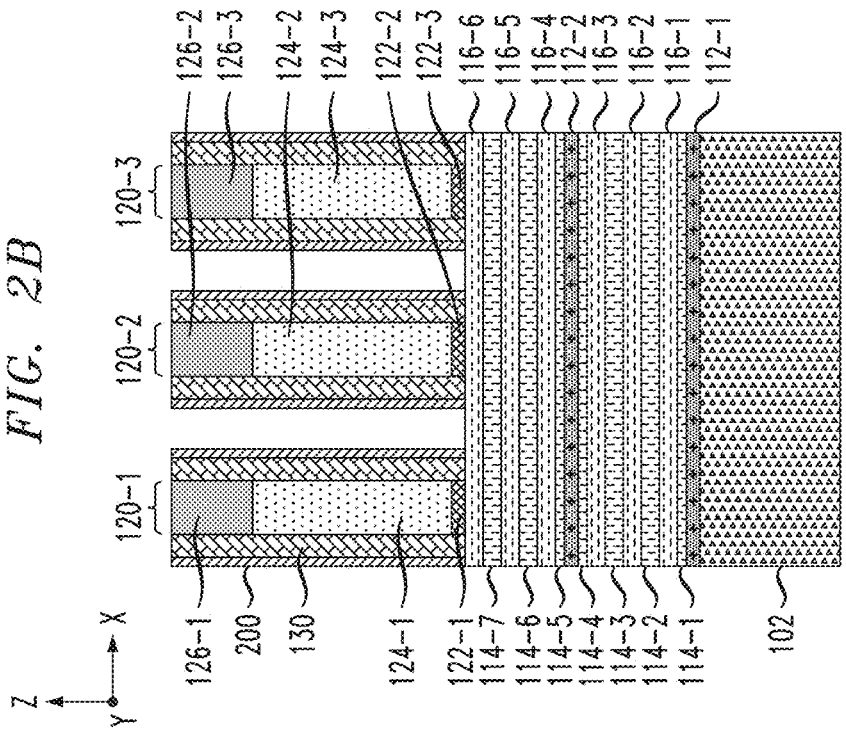
FIGS. 2A and 2B are schematic views of the semiconductor structure of FIGS. 1A-IC after the formation of a sidewall liner on a sidewall spacer, according to an illustrative embodiment.

Illustrative embodiments will now be described in further detail below. Devices and methods are provided to fabricate a semiconductor structure having enhanced carrier mobility for both nFET and pFET devices and bottom isolation.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

It is to be appreciated that the term "coupled" as illustratively used herein with respect to, for example, transistors or parts thereof being coupled to capacitors or parts thereof, refers to electrical connection.

To provide spatial context to the different structural orientations of the semiconductor device structures shown throughout the drawings, illustrative XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings. The term "top-down view" as used herein denotes a view in the Z-direction.

FIGS. 1A through 13B schematically illustrate a method for fabricating such a semiconductor structure having bottom isolation and enhanced carrier mobility for both nFET and pFET devices, according to an illustrative embodiment.

FIGS. 1A-1C are schematic views of a semiconductor structure 100 at an intermediate stage of fabrication after the formation of semiconductor substrate 102, shallow trench isolation (STI) layer 104, nanosheet stack structure 110, gate structures 120-1 through 120-3 and sidewall spacer 130. FIG. 1C is a schematic top-down view (X-Y plane) of the semiconductor structure 100, FIG. 1A is a schematic cross-sectional side view (Y-Z plane) of the semiconductor structure 100 along section line A-A of FIG. 1C and FIG. 1B is a schematic cross-sectional side view (X-Z plane) of the semiconductor structure 100 along section line B-B of FIG. 1C.

While the semiconductor substrate 102 is illustrated as a generic substrate layer, it is to be understood that the semiconductor substrate 102 may comprise one of different types of semiconductor substrate structures and materials. For example, in one embodiment, the semiconductor substrate 102 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g., II-V), etc. In another embodiment, the semiconductor substrate 102 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure. It is to be noted that in each drawing, the Y-Z plane represents a plane that is parallel to the plane of the semiconductor substrate 102 (e.g., wafer) being processed.

The STI layer 104 is formed of any type of insulating material, such an oxide material, which is suitable for the given fabrication process flow. In one embodiment, a patterning process is performed by forming an etch mask (e.g., a photoresist mask) having openings which define an image of the STI layer 104, and using the etch mask to etch semiconductor substrate 102 to form trenches at a depth below the upper surface of the semiconductor substrate 102. The etch mask can be formed using any suitable patterning process including, but not limited to, a photolithography process, or a multi-patterning process. The etching can be performed using one or more sequential dry etch processes with etch chemistries that are suitable to etch the semiconductor substrate 102. The insulating material (e.g., silicon oxide) can be deposited, planarized, and recessed using known techniques to form the STI layer 104.

The nanosheet stack structure 110 comprises sacrificial nanosheet layers 112-1 and 112-2, individually and collectively referred to herein as sacrificial nanosheet layers 112, nanosheet channel layers 114-1 through 114-7, individually and collectively referred to herein as nanosheet channel layers 114, and sacrificial nanosheet layers 116-1 through 116-6, individually and collectively referred to herein as sacrificial nanosheet layers 116. Each nanosheet channel layer 114 is disposed between a sacrificial nanosheet layer 112 and a sacrificial nanosheet layer 116 or between a pair of the sacrificial nanosheet layers 116. In illustrative embodiments, the sacrificial nanosheet layers 112, nanosheet channel layers 114 and sacrificial nanosheet layers 116 comprise epitaxial semiconductor layers that are sequentially grown.

For example, the sacrificial nanosheet layer 112-1 is epitaxially grown on a surface of the semiconductor substrate 102, the nanosheet channel layer 114-1 is epitaxially grown on the sacrificial nanosheet layer 112-1, the sacrificial nanosheet layer 116-1 is epitaxially grown on the nanosheet channel layer 114-1, the nanosheet channel layer 114-2 is epitaxially grown on the sacrificial nanosheet layer 116-1, the sacrificial nanosheet layer 116-2 is epitaxially grown on the nanosheet channel layer 114-2, the nanosheet channel layer 114-3 is epitaxially grown on the sacrificial nanosheet layer 116-2, the sacrificial nanosheet layer 116-3 is epitaxially grown on the nanosheet channel layer 114-3, the nanosheet channel layer 114-4 is epitaxially grown on the sacrificial nanosheet layer 116-3, the sacrificial nanosheet layer 112-2 is epitaxially grown on the nanosheet channel layer 114-4, the nanosheet channel layer 114-5 is epitaxially grown on the sacrificial nanosheet layer 112-2, the sacrificial nanosheet layer 116-4 is epitaxially grown on the nanosheet channel layer 114-5, the nanosheet channel layer 114-6 is epitaxially grown on the sacrificial nanosheet layer 116-4, the sacrificial nanosheet layer 116-5 is epitaxially grown on the nanosheet channel layer 114-6, the nanosheet channel layer 114-7 is epitaxially grown on the sacrificial nanosheet layer 116-5 and the sacrificial nanosheet layer 116-6 is epitaxially grown on the nanosheet channel layer 114-7.

In one embodiment, the layers of the nanosheet stack structure 110 comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow. The types of materials that are utilized to form the layers of the nanosheet stack structure 110 will depend on various factors such as the type of nanosheet FET device (p-type, or n-type), and the desired level of etch selectivity between the layers, as well as providing sufficient lattice matching between the materials of the layers to ensure proper (e.g., defect-free) epitaxial growth of the layers.

For example, in one embodiment, the nanosheet channel layers 114 are formed of epitaxial silicon (Si), which is suitable to serve as semiconductor channel layers for a nanosheet FET device. When the nanosheet channel layers 114 are formed of crystalline Si, the sacrificial nanosheet layers 112 and 116, which serve as sacrificial layers that are subsequently etched away to release the nanosheet channel layers 114, can be formed of an epitaxial silicon-germanium (SiGe) alloy. This allows the epitaxial SiGe material of the sacrificial nanosheet layers 112 and 116 to be etched selective to the epitaxial Si material of the nanosheet channel layers 114 in a subsequent process step to "release" the nanosheet channel layers 114. In some embodiments, the Ge concentration of one or more of the sacrificial nanosheet layers 112 and 116 may be varied to provide etch selectivity between the sacrificial nanosheet layers 112 and 116.

While the nanosheet stack structure 110 is shown to include seven nanosheet channel layers 114, in other embodiments, the nanosheet stack structure 110 can be fabricated with more or less than seven nanosheet channel layers. Similarly, while the nanosheet stack structure 110 is shown to include two sacrificial nanosheet layers 112 and six sacrificial nanosheet layers 116, in other embodiments, the nanosheet stack structure 110 can be fabricated with more or less sacrificial nanosheet layers 112 and 116.

In some embodiments, the sacrificial nanosheet layers 112 may comprise an SiGe alloy having a high percentage of Ge while sacrificial nanosheet layers 116 may comprise SiGe alloys having a lower percentage of Ge than sacrificial nanosheet layers 112, such that sacrificial nanosheet layers 112 are selectively etchable relative to nanosheet channel layers 114 and sacrificial nanosheet layers 116. For example, in some embodiments, sacrificial nanosheet layers 112 may comprise an SiGe alloy having a range of about 50% to about 90% Ge, sacrificial nanosheet layers 116 may comprise an SiGe alloy having a range of about 25% to 40% Ge and nanosheet channel layers 114 may comprise Si or an SiGe alloy having a range of about 5% to about 15% Ge where the sacrificial nanosheet layers 112 and sacrificial nanosheet layers 116 are selectively etchable relative to each other and to nanosheet channel layers 114. In other embodiments, sacrificial nanosheet layers 112, sacrificial nanosheet layers 116 and nanosheet channel layers 114 may comprise any other concentrations of Ge or other selectively etchable materials.

With continued reference to FIG. 1, the sacrificial nanosheet layers 112 and 116 may be formed with a thickness that defines the spacing size above and below the nanosheet channel layers 114, in which high-k dielectric material and work function metal will be formed. The size of the spacing and the type of WFM material(s) to be formed in the spaces above and below the nanosheet channel layers 114 defines, in part, the threshold voltage (Vt) of the nanosheet FET device. In one embodiment, the thickness of the sacrificial nanosheet layers 112 and 116 is in a range of about 8 nm to about 15 nm.

In one embodiment, the thickness of the nanosheet channel layers 114 is in a range of about 2 nm to about 10 nm, although the nanosheet channel layers 114 can be formed with other thickness ranges, depending on the application. For example, as seen in FIG. 1, nanosheet channel layers 114-1, 114-4, and 114-5 have a smaller thickness than nanosheet channel layers 114-2, 114-3, 114-6 and 114-7. For example, nanosheet channel layers 114-1, 114-4, and 114-5 can have a thickness ranging from about 1.5 nm to 3 nm, and nanosheet channel layers 114-2, 114-3, 114-6 and 114-7 can have a thickness ranging from about 6 nm to 12 nm.

The gate structures 120-1 through 120-3 comprise respective dummy gate dielectric 122-1 through 122-3, dummy gate electrodes 124-1 through 124-3 and gate capping layers 126-1 through 126-3 that may be formed using standard deposition and lithographic processes.

For example, a conformal layer of silicon oxide may be deposited over the semiconductor structure 100 to form a dummy gate dielectric layer followed by a blanket deposition of a sacrificial material such as polysilicon or amorphous silicon material to form the dummy gate electrode layer. In some embodiments, a CMP process is performed to planarize one or both of the deposited materials. A hard mask layer is formed on the planarized surface of the polysilicon layer by depositing a layer of dielectric material such as silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials commonly used to form gate capping layers.

The hard mask layer is then patterned to form the gate capping layers 126 of the gate structures 120, which define an image of the dummy gate structure. The gate capping layers 126 are then utilized as an etch hardmask to anisotropically etch (e.g., RIE) the sacrificial polysilicon layer and silicon oxide layer to thereby form the dummy gate dielectric 122 and dummy gate electrodes 124 of the gate structures 120. In illustrative embodiments, the etching chemistry for patterning the dummy gate electrodes 124 is selective to the gate capping layers 126, the dummy gate dielectric layer 122 and the STI layer 104.

The sidewall spacer 130 are formed by depositing a conformal layer of dielectric material over the entire surface of the semiconductor structure 100. The conformal layer of dielectric material can be formed of SiN, SiCN, SiON, BN, SiBN, SiBCN, SiOC, SiOCN, or any other type of dielectric material that is commonly used to form insulating sidewall spacers of FET devices, and deposited using known techniques such as atomic layer deposition (ALD), CVD and PVD. In illustrative embodiments, the dielectric material of the sidewall spacer 130 is different than the material of the gate capping layers 126. For example, the gate capping layers 126 may comprise SiN while the sidewall spacer 130 may comprise another material such as, e.g., SiCN, SiON, BN, SiBN, SiBCN, SiOC or SiOCN. The conformal layer of dielectric material is then patterned by performing an anisotropic dry etch process, such as RIE, to etch down the conformal layer of dielectric material in a vertical direction. This etch process is performed selective to the materials of the STI layer 104 nanosheet stack structure 110 and gate capping layers 126. The etch process results in the formation of the sidewall spacer 130 on the gate structures 120 and nanosheet stack structure 110, which surround the sidewall surfaces of the gate structures 120 and nanosheet stack structure 110. In one embodiment, the thickness of the sidewall spacer 130 is in a range of about 3 nm to about 10 nm, although the sidewall spacer 130 can be formed with other thickness ranges. During the etch process to form the sidewall spacer 130, the portions of the conformal layer of dielectric material on the lateral surfaces of the semiconductor structure 100, e.g., on the upper surfaces of the STI layer 104, nanosheet stack structure 110 and gate capping layers 126, will be etched away, exposing the upper surfaces of the STI layer 104, nanosheet stack structure 110 and gate capping layers 126.

Figure 2A:
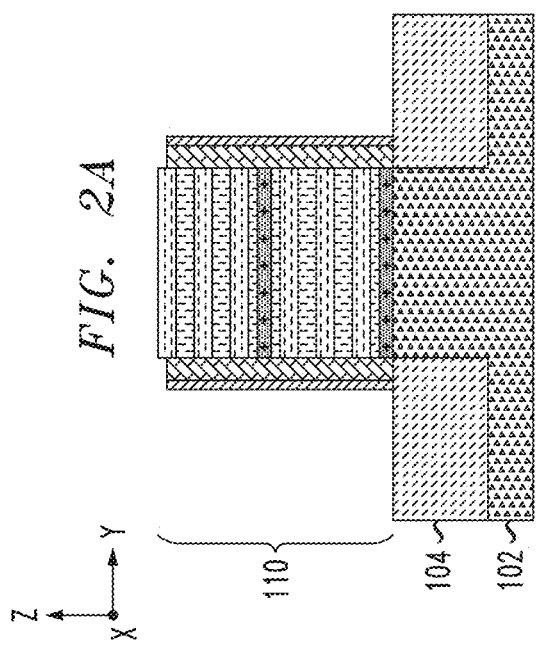

FIGS. 2A and 2B are schematic views of a semiconductor structure 100 at an intermediate stage of fabrication after the formation of sidewall liner 200 on the sidewall spacer 130. FIG. 2A is a schematic cross-sectional side view (Y-Z plane) of the semiconductor structure 100 along section line A-A of FIG. 1C and FIG. 2B is a schematic cross-sectional side view (X-Z plane) of the semiconductor structure 100 along section line B-B of FIG. 1C.

The sidewall liner 200 is formed by depositing a conformal layer of dielectric material over the entire surface of the semiconductor structure 100. The conformal layer of dielectric material can be formed of SiN, SiCN, SiON, BN, SiBN, SiBCN, SiOC, SiOCN, or any other type of dielectric material that is commonly used to form insulating sidewall spacers of FET devices, and deposited using known techniques such as atomic layer deposition (ALD), CVD and PVD. In illustrative embodiments, the dielectric material of the sidewall liner 200 is different than the material of the sidewall spacer 130. In some embodiments, the dielectric material of the sidewall liner 200 is the same as the material of the gate capping layers 126. For example, the sidewall liner 200 and the gate capping layers 126 may comprise SiN while the sidewall spacer 130 may comprise another material such as, e.g., SiCN, SiON, BN, SiBN, SiBCN, SiOC or SiOCN that may be selectively etched relative to the material of the sidewall liner 200. The conformal layer of dielectric material is then patterned by performing an anisotropic dry etch process, such as RIE, to etch down the conformal layer of dielectric material in a vertical direction. This etch process is performed selective to the materials of the STI layer 104 nanosheet stack structure 110 and sidewall spacer 130. The etch process results in the formation of the sidewall liner 200 on the sidewall spacer 130, which surround the sidewall surfaces of the sidewall spacer 130. In one embodiment, the thickness of the sidewall liner 200 is in a range of about 2 nm to about 5 nm, although the sidewall liner 200 can be formed with other thickness ranges. In illustrative embodiments, the sidewall liner 200 has a smaller thickness than the sidewall spacer 130. During the vertical etch process to form the sidewall liner 200, the portions of the conformal layer of dielectric material on the lateral surfaces of the semiconductor structure 100, e.g., on the upper surfaces of the STI layer 104, nanosheet stack structure 110, gate capping layers 126 and sidewall spacer 130, will be etched away, exposing the upper surfaces of the STI layer 104, nanosheet stack structure 110, gate capping layers 126 and sidewall spacer 130.

FIGS. 3A and 3B are schematic views of a semiconductor structure 100 at an intermediate stage of fabrication after the formation of an etch mask 300 and the recessing of the nanosheet stack structure 110 and semiconductor substrate 102 between the gate structures 120 according to the pattern defined by the etch mask 300, sidewall spacer 130 and sidewall liner 200 to form trenches 132 between the gate structures 120. FIG. 3A is a schematic cross-sectional side view (Y-Z plane) of the semiconductor structure 100 along section line A-A of FIG. 1C and FIG. 3B is a schematic cross-sectional side view (X-Z plane) of the semiconductor structure 100 along section line B-B of FIG. 1C.

As illustrated in FIGS. 3A and 3B, a lithographic process is utilized to form an etch mask over a portion of the semiconductor structure 100. For example, an organic planarizing layer (OPL) may be coated on the semiconductor structure 100, followed by a lithographic process to pattern the OPL to form an etch mask 300. The OPL may comprise, for example, a resin material that is applied by spin coating and baked to enhance planarization. The patterned portion of the OPL is removed to expose a portion of the semiconductor structure 100 using standard lithographic techniques, for example, as shown in FIG. 3A. An etch process is utilized to recess the exposed portion of the nanosheet stack structure 110 down into the semiconductor substrate 102 according to a pattern defined by the etch mask 300, sidewall spacer 130 and sidewall liner 200 to form trenches 132. For example, dry or wet etching techniques may be utilized to recess the exposed portion of the nanosheet stack structure 110 and the semiconductor substrate 102 according to the pattern in one or more steps. The etch chemistry that is used to perform the recess may be selective to one or more of the materials of the STI layer 104, gate capping layers 126, sidewall spacer 130, sidewall liner 200 and etch mask 300. In some embodiments, a directional RIE process is utilized to recess the exposed portion of the nanosheet stack structure 110 down into the semiconductor substrate 102 according to the pattern defined by the etch mask 300, sidewall spacer 130 and sidewall liner 200 with the chemistry being selective to the material of the STI layer 104, gate capping layers 126, sidewall spacer 130, sidewall liner 200 and etch mask 300.

FIGS. 4A and 4B are schematic views of a semiconductor structure 100 at an intermediate stage of fabrication after removal of the sidewall spacer 130 from the trenches 132. FIG. 4A is a schematic cross-sectional side view (Y-Z plane) of the semiconductor structure 100 along section line A-A of FIG. 1C and FIG. 4B is a schematic cross-sectional side view (X-Z plane) of the semiconductor structure 100 along section line B-B of FIG. 1C.

An etch process is utilized to remove the sidewall spacer 130 from the trenches 132 where the etch chemistry may be selective to one or more of the materials of the semiconductor substrate 102, STI layer 104, nanosheet stack structure 110, gate capping layers 126, sidewall liner 200 and etch mask 300. For example, dry or wet etching techniques may be utilized to remove the sidewall spacer 130 from the trenches 132. As can be seen in FIG. 4B, a portion of sidewall spacer 130 will also be removed from the sidewalls of the gate structures 120 as part of the etch process, e.g., roughly equivalent to the thickness of the sidewall spacer 130 on the trenches 132.

FIGS. 5A and 5B are schematic views of a semiconductor structure 100 at an intermediate stage of fabrication after removal of the sidewall liner 200 from the trenches 132 and the gate structures 120. FIG. 5A is a schematic cross-sectional side view (Y-Z plane) of the semiconductor structure 100 along section line A-A of FIG. 1C and FIG. 5B is a schematic cross-sectional side view (X-Z plane) of the semiconductor structure 100 along section line B-B of FIG. 1C.

An etch process is utilized to remove the sidewall liner 200 from the trenches 132 and gate structures 120 where the etch chemistry may be selective to one or more of the materials of the semiconductor substrate 102, STI layer 104, nanosheet stack structure 110, gate capping layers 126, sidewall spacer 130 and etch mask 300. For example, dry or wet etching techniques may be utilized to remove the sidewall liner 200 from the trenches 132 and gate structures 120. For example, as can be seen in FIGS. 4A and 4B, sidewall liner 200 is completely removed, exposing the side surfaces of the etch mask 300 and the sidewall spacer 130 on the gate structures 120.

Figures 6A, 6B:
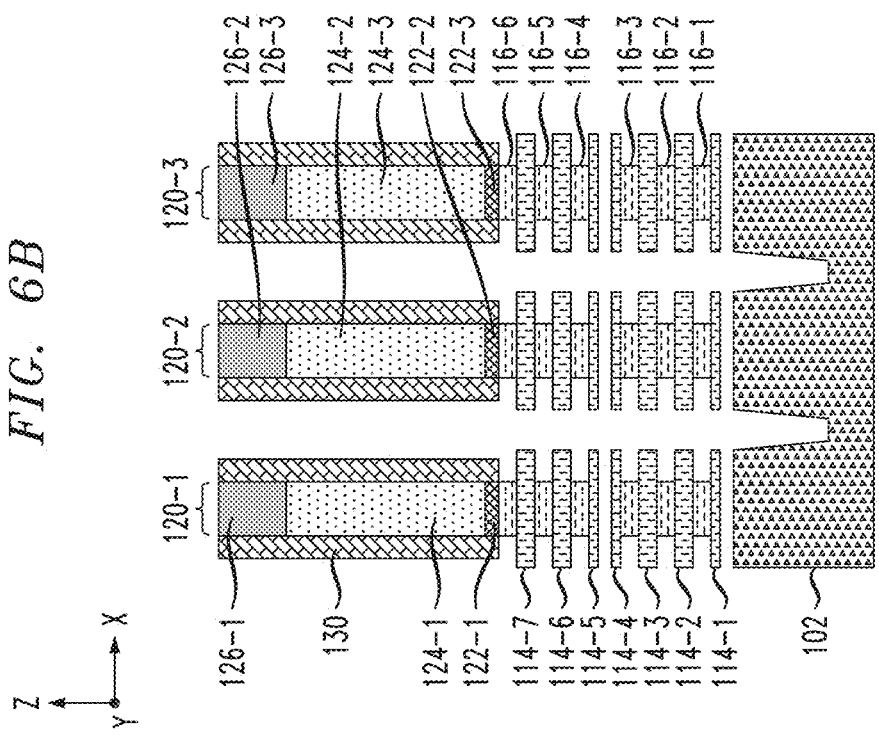
FIGS. 6A and 6B are schematic views of the semiconductor structure of FIGS. 5A and 5B after removal of the etch mask, removal of some sacrificial nanosheet layers and lateral recessing of the remaining sacrificial nanosheet layers, according to an illustrative embodiment.

FIGS. 6A and 6B are schematic views of a semiconductor structure 100 at an intermediate stage of fabrication after removal of the etch mask 300, removal of the sacrificial nanosheet layers 112 and lateral recessing of the sacrificial nanosheet layers 116. FIG. 6A is a schematic cross-sectional side view (Y-Z plane) of the semiconductor structure 100 along section line A-A of FIG. 1C and FIG. 6B is a schematic cross-sectional side view (X-Z plane) of the semiconductor structure 100 along section line B-B of FIG. 1C.

The etch mask 300 may be removed, for example, using a plasma etch process or ash process to remove the OPL material.

A dry or wet etch processes may be utilized to remove sacrificial nanosheet layers 112 without removing the nanosheet channel layers 114 and sacrificial nanosheet layers 116. For example, the etch chemistry and process may be selective to the materials of the semiconductor substrate 102, STI layer 104, nanosheet channel layers 114, sacrificial nanosheet layers 116, sidewall spacer 130 and gate capping layers 126. For example, the etch chemistry may be configured to remove the SiGe alloy concentration of the sacrificial nanosheet layers 112, e.g., 60%, while being selective to the lower concentrations of Ge found in nanosheet channel layers 114, e.g., 0%, and sacrificial nanosheet layers 116, e.g., 25%. In some embodiments, a wet etch process may be utilized to remove the sacrificial nanosheet layers 112. In one embodiment, the SiGe material of the sacrificial nanosheet layers 112 can be selectively etched (with high etch selectivity) using a gas phase HCl (hydrochloric acid) or wet etch solution to laterally etch the SiGe material of the sacrificial nanosheet layers 112 selective to the material of the nanosheet channel layers 114 and sacrificial nanosheet layers 116. The gas phase HCl (hydrochloric acid) provides high etch selectivity when, for example, the sacrificial nanosheet layers 116 and the nanosheet channel layers 114 are formed of Si or SiGe with a lower Ge concentration than the SiGe material of the sacrificial nanosheet layers 112.

The exposed sidewall surfaces of sacrificial nanosheet layers 116 are laterally etched to form recesses in the sidewalls of the nanosheet stack structure 110. As shown in FIG. 6B, the exposed sidewall surfaces of the sacrificial nanosheet layers 116 are laterally recessed to a pre-determined depth, e.g., in the x-direction. The amount of lateral recess is controlled through a timed etch. In one embodiment, the depth of the recess is substantially equal to the combined width of the sidewall spacer 130 and sidewall liner 200 (FIG. 2).

The lateral etch process can be performed using an isotropic wet etch process with an etch solution that is suitable to etch the semiconductor material, e.g., SiGe, of the sacrificial nanosheet layers 116 selective to the semiconductor material, e.g., Si, of the semiconductor substrate 102 and the nanosheet channel layers 114, the STI layer 104, the gate capping layers 126, the sidewall spacers 130 and other exposed elements.

Figure 7B:
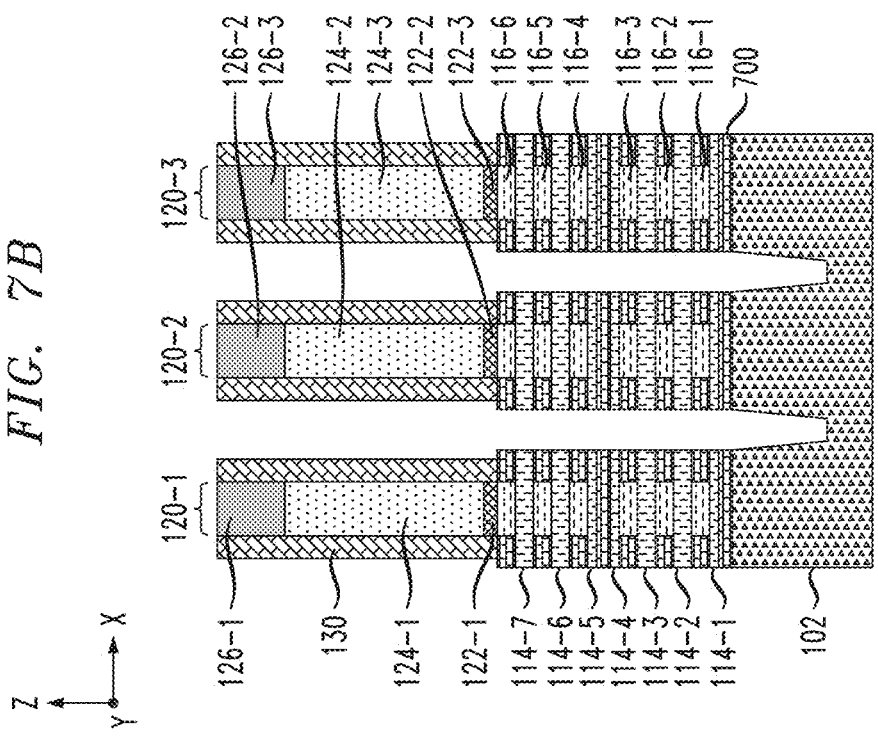
FIGS. 7A and 7B are schematic views of the semiconductor structure of FIGS. 6A and 6B after the formation of a dielectric layer in the recessed sidewalls and exposed portions of the nanosheet stack structure, according to an illustrative embodiment.
Figure 7A:
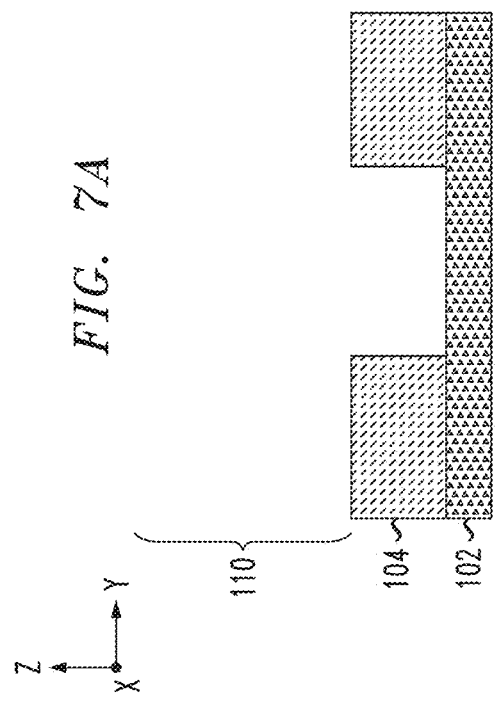

FIGS. 7A and 7B are schematic views of a semiconductor structure 100 at an intermediate stage of fabrication after the formation of a dielectric layer 700 in the recessed sidewalls and exposed portions of the nanosheet stack structure 110. FIG. 7A is a schematic cross-sectional side view (Y-Z plane) of the semiconductor structure 100 along section line A-A of FIG. 1C and FIG. 7B is a schematic cross-sectional side view (X-Z plane) of the semiconductor structure 100 along section line B-B of FIG. 1C.

For example, a dielectric material is deposited to form the dielectric layer 700 in the recessed sidewalls and exposed portions of the nanosheet stack structure 110. In one embodiment, the dielectric layer 700 is formed by depositing a conformal layer of dielectric material over the semiconductor device structure until the recessed sidewalls and exposed portions of the nanosheet stack structure 110 are filled with dielectric material, followed by an isotropic etch back to remove the excess dielectric material. In one embodiment, the dielectric layer 700 is formed of the same dielectric material used to form the gate capping layers 126, e.g., SiN in some embodiments. For example, the dielectric layer 700 can be formed of SiN, SiBCN, SiCON, or any other type of dielectric material (e.g., a low-k dielectric material having a k of less than 5) which is commonly used to form insulating nanosheet sidewall spacers of FET devices. In one embodiment, the dielectric material is conformally deposited using a highly conformal deposition process, such as ALD, to ensure that the recessed sidewalls and exposed portions of the nanosheet stack structure 110 are sufficiently filled with dielectric material. Other deposition methods such as CVD and PVD can be utilized to deposit a highly conformal layer of dielectric material to fill the recessed sidewalls and exposed portions of the nanosheet stack structure 110. The conformal layer of dielectric material can be etched back using an isotropic wet etch process to remove the excess dielectric material on the sidewalls of the nanosheet stack structure 110 and expose the sidewalls of the nanosheet channel layers 114 while leaving the dielectric material in the recessed sidewalls and exposed portions of the nanosheet stack structure 110 to form the dielectric layer 700. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HF/EG), hydrochloric acid (HCl), hot phosphorus or any combination thereof.

FIGS. 8A and 8B are schematic views of a semiconductor structure 100 at an intermediate stage of fabrication after the growth of sacrificial epitaxial layer 800-1, bottom source/drain regions 802, sacrificial epitaxial layer 800-2 and top source/drain regions 804 in the trenches 132. FIG. 8A is a schematic cross-sectional side view (Y-Z plane) of the semiconductor structure 100 along section line A-A of FIG. 1C and FIG. 8B is a schematic cross-sectional side view (X-Z plane) of the semiconductor structure 100 along section line B-B of FIG. 1C.

Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration can range from $1 \times 10^{19}$ cm; to $3 \times 10^{21}$ cm$^{-3}$, or preferably between $2 \times 10^{20}$ cm$^{-3}$ to $3 \times 10^{21}$ cm$^{-3}$.

Sacrificial epitaxial layer 800-1 may be formed or grown in the trenches 132 from the exposed semiconductor substrate 102 and nanosheet channel layers 114 and recessed or patterned back to the desired height relative to a first portion 700-1 of the dielectric layer 700 in the z-direction. For example, the sacrificial epitaxial layer 800-1 may be recessed such that it is below the level of the nanosheet channel layer 114-1 in the z-direction, as shown in FIG. 8B. In illustrative embodiments, sacrificial epitaxial layer 800-1 may comprise a material that is selectively etchable relative to semiconductor substrate 102, nanosheet channel layers 114, gate capping layers 126, sidewall spacer 130 and dielectric layer 700. For example, sacrificial epitaxial layer 800-1 may comprise Ge in some embodiments.

Bottom source/drain regions 802 may be formed, for example, by incorporation of a suitable dopant, such as using in-situ doping during epitaxy growth, ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride (BF$_2$), gallium (Ga), indium (In), and thallium (Tl). The bottom source/drain regions 802 may also be formed by an epitaxial growth process such as that described above. In some embodiments, the epitaxy process comprises in-situ doping (dopants are incorporated in epitaxy material during epitaxy). In some embodiments, as shown in FIG. 8B, the bottom source/drain regions 802 may be formed or grown over sacrificial epitaxial layer 800-1 and the exposed nanosheet channel layers 114, and then recessed or patterned back to the desired height relative to a second portion 700-2 of the dielectric layer 700 in the z-direction. For example, as shown in FIG. 8B, the bottom source/drain regions 802 are recessed to about a bottom surface of the portion 700-2 in the z-direction, as shown in FIG. 8B. In illustrative embodiments, the epitaxial material of the bottom source/drain regions 802 is different than the epitaxial material of the sacrificial epitaxial layer 800-1 to allow the sacrificial epitaxial layer 800-1 to be selectively removed. In some embodiments, for example, the bottom source/drain regions 802 may comprise pFET epitaxy including SiGe:B 55%.

Sacrificial epitaxial layer 800-2 may be formed or grown in the trenches 132 from the bottom source/drain regions 802 and the remaining exposed nanosheet channel layers 114 and recessed or patterned back to the desired height relative to the second portion 700-2 of the dielectric layer 700 in the z-direction. For example, the sacrificial epitaxial layer 800-2 may be recessed to about a top surface of the portion 700-2 in the z-direction, as shown in FIG. 8B. In illustrative embodiments, sacrificial epitaxial layer 800-2 may comprise a material that is selectively etchable relative to semiconductor substrate 102, nanosheet channel layers 114, gate capping layers 126, sidewall spacer 130, dielectric layer 700 and bottom source/drain regions 802. For example, sacrificial epitaxial layer 800-2 may comprise Ge in some embodiments.

Top source/drain regions 804 may be formed, for example, by implantation of a suitable dopant, such as using in-situ doping during epitaxy growth, ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride (BF2), gallium (Ga), indium (In), and thallium (Tl). The top source/drain regions 804 may also be formed by an epitaxial growth process such as that described above. In some embodiments, the epitaxy process comprises in-situ doping (dopants are incorporated in epitaxy material during epitaxy). In some embodiments, as shown in FIG. 8B, the top source/drain regions 804 may be formed or grown over sacrificial epitaxial layer 800-2 and the remaining exposed nanosheet channel layers 114, and then recessed or patterned back to the desired height relative to the sidewall spacer 130 and dielectric layer 700 in the z-direction. For example, as shown in FIG. 8B, the top source/drain regions 804 are recessed to a level above the dielectric layer 700 in the z-direction and against the sidewall spacer 130 such that the dielectric layer is not exposed. In other embodiments, the dielectric layer 700 may be exposed while the nanosheet channel layer 114-7 is still covered by the top source/drain regions 804. In some embodiments, for example, the top source/drain regions 804 may comprise nFET epitaxy including Si:P.

In illustrative embodiments, the epitaxial material of the bottom source/drain regions 802 and top source/drain regions 804 are different than the epitaxial material of the sacrificial epitaxial layers 800-1 and 800-2 to allow the sacrificial epitaxial layers 800-1 and 800-2 to be selectively removed.

FIGS. 9A and 9B are schematic views of a semiconductor structure 100 at an intermediate stage of fabrication after the removal of sacrificial epitaxial layers 800-1 and 800-2. FIG. 9A is a schematic cross-sectional side view (Y-Z plane) of the semiconductor structure 100 along section line A-A of FIG. 1C and FIG. 9B is a schematic cross-sectional side view (X-Z plane) of the semiconductor structure 100 along section line B-B of FIG. 1C.

A dry or wet etch processes may be utilized to selectively remove sacrificial epitaxial layers 800-1 and 800-2. For example, the etch chemistry and process may be selective to the materials of the semiconductor substrate 102, STI layer 104, sidewall spacer 130, gate capping layers 126, dielectric layer 700, bottom source/drain regions 802 and top source/drain regions 804. For example, the etch chemistry may be configured to remove the material of the sacrificial epitaxial layers 800-1 and 800-2 while being selective to material found in bottom source/drain regions 802 and top source/drain regions 804. For example, in an illustrative embodiment where the sacrificial epitaxial layers 800-1 and 800-2 comprise Ge, the bottom source/drain regions 802 comprise SiGe:B 55% and the top source/drain regions 804 comprise Si:P, the etch chemistry may selectively remove the high Ge concentration materials of the sacrificial epitaxial layers 800-1 and 800-2 without removing the materials of the bottom source/drain regions 802 and the top source/drain regions 804.

In some embodiments, a wet etch process may be utilized to remove the sacrificial epitaxial layers 800-1 and 800-2. In one embodiment, the Ge material of the sacrificial epitaxial layers 800-1 and 800-2 can be selectively etched (with high etch selectivity) using a gas phase HCl (hydrochloric acid) or wet etch solution to etch the Ge material of the sacrificial epitaxial layers 800-1 and 800-2 selective to the material of the bottom source/drain regions 802 and top source/drain regions 804. The gas phase HCl (hydrochloric acid) provides high etch selectivity when, for example, the bottom source/drain regions 802 and top source/drain regions 804 are formed of Si or SiGe with a lower Ge concentration than the Ge material of the sacrificial epitaxial layers 800-1 and 800-2.

Figure 10A:
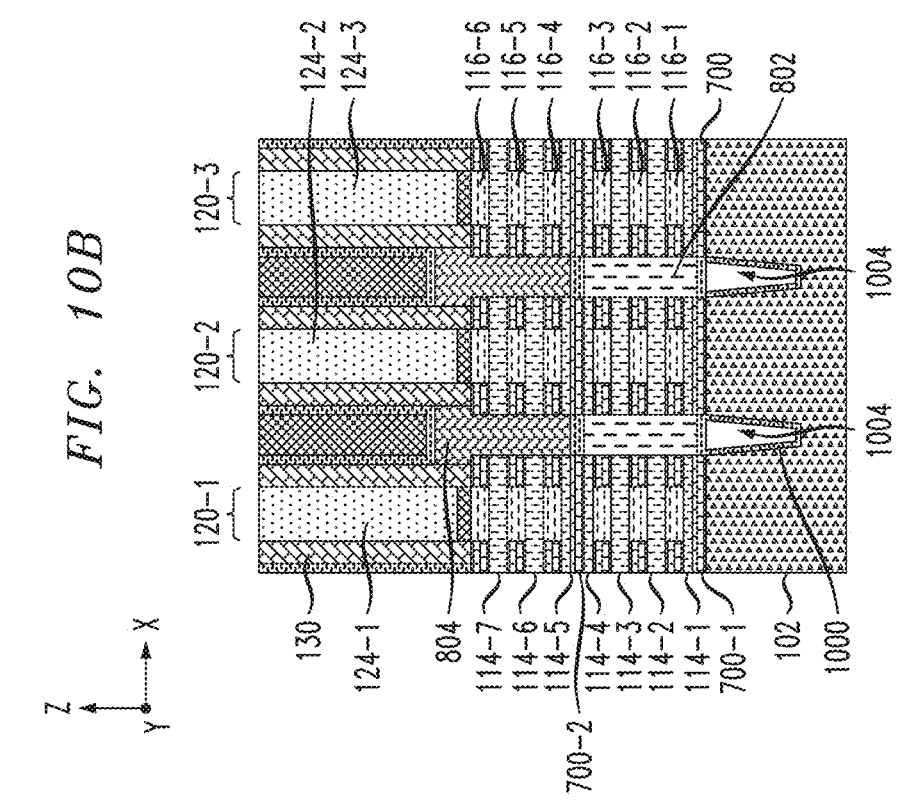
FIGS. 10A and 10B are schematic views of the semiconductor structure of FIGS. 9A and 9B after the formation of a dielectric layer, sometimes referred to as a contact etch stop liner (CESL), and the formation of an inter-level dielectric (ILD) layer over the semiconductor structure, according to an illustrative embodiment.
Figure 10B:
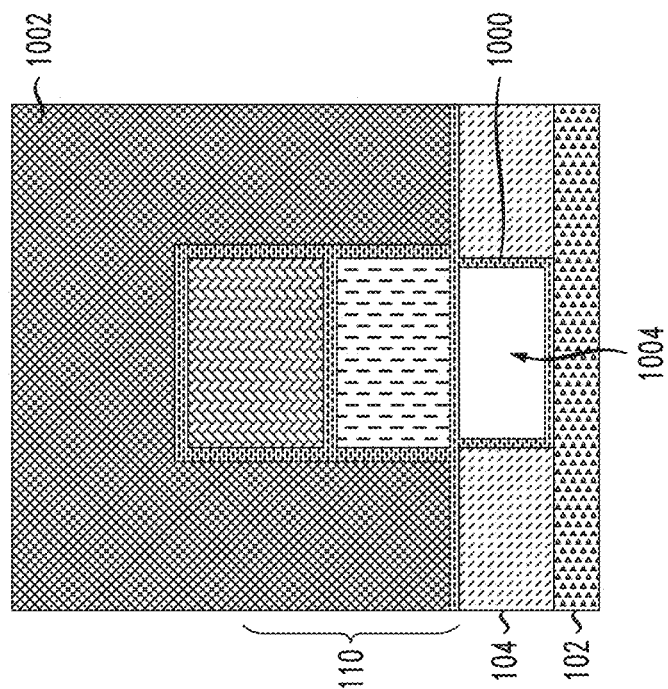

FIGS. 10A and 10B are schematic views of a semiconductor structure 100 at an intermediate stage of fabrication after the formation of a dielectric layer 1000, sometimes referred to as a contact etch stop liner (CESL), and the formation of inter-level dielectric (ILD) layer 1002 over the semiconductor structure 100. FIG. 10A is a schematic cross-sectional side view (Y-Z plane) of the semiconductor structure 100 along section line A-A of FIG. 1C and FIG. 10B is a schematic cross-sectional side view (X-Z plane) of the semiconductor structure 100 along section line B-B of FIG. 1C.

A dielectric material is deposited to form the dielectric layer 1000 on the surfaces of the spaces left by the removal of the sacrificial epitaxial layers 800-1 and 800-2 and on the exposed surfaces of the sidewall spacer 130, gate capping layers 126 and top source/drain regions 804. In one embodiment, the dielectric layer 1000 is formed by depositing a conformal layer of dielectric material over the semiconductor structure 100, followed by an isotropic etch back to remove the excess dielectric material, if necessary. The dielectric layer 1000 can be formed of SiN, SiBCN, SiCON, or any other type of dielectric material (e.g., a low-k dielectric material having a k of less than 5) which is commonly used to form insulating spacers of FET devices. In some embodiments, the dielectric layer 1000 is formed of the same dielectric material used to form the dielectric layer 700. For example, both the dielectric layer 700 and the dielectric layer 1000 may be formed of SiN in some embodiments. In one embodiment, the dielectric material is conformally deposited using a highly conformal deposition process, such as ALD, to ensure that the space exposed by removal of sacrificial epitaxial layer 800-2 is sufficiently filled with dielectric material while only a liner of dielectric material is deposited on the surfaces exposed by removal of the sacrificial epitaxial layer 800-1 such that the dielectric layer 1000 forms air gaps 1004 below the bottom source/drain regions 802 where the sacrificial epitaxial layer 800-1 was located. Other deposition methods such as CVD can be utilized to deposit a highly conformal layer of dielectric material to fill the recessed sidewalls and exposed portions of the nanosheet stack structure 110.

A dielectric material, including, but not limited to $SiO_x$, low temperature oxide (LTO), high temperature oxide (HTO), flowable oxide (FOX) or some other dielectric, is deposited to form ILD layer 1002 on the semiconductor structure 100. The ILD layer 1002 can be deposited using deposition techniques including, but not limited to, CVD, PECVD, RFCVD, PVD, ALD, MLD, MBD, PLD, and/or LSMCD, sputtering, and/or plating. Planarization, for example, chemical mechanical polishing (CMP) can be performed to remove excess material from ILD layer 1002 and planarize the resulting structure. The planarization can be performed down to the dummy gate electrodes 124 of the gate structures 120 such that the gate capping layers 126 are removed and the dummy gate electrodes 124 are exposed. In accordance with an exemplary embodiment, the ILD layer 1002 electrically isolates the different gate structures 120 from each other.

FIGS. 11A and 11B are schematic views of a semiconductor structure 100 at an intermediate stage of fabrication after the removal of the dummy gate electrodes 124 and the sacrificial nanosheet layers 116 of the gate structures 120 to release the channels of the gate structures 120. FIG. 11A is a schematic cross-sectional side view (Y-Z plane) of the semiconductor structure 100 along section line A-A of FIG. 1C and FIG. 11B is a schematic cross-sectional side view (X-Z plane) of the semiconductor structure 100 along section line B-B of FIG. 1C.

The dummy gate electrodes 124 are etched away using known etching techniques and etch chemistries. For example, the dummy gate material can be removed using a selective dry etch or wet etch process with suitable etch chemistries, including ammonium hydroxide ($NH_4OH$), tetramethylammonium hydroxide (TMAH), or SF6 plasma. The etching of the dummy gate electrodes 124 is selective to, e.g., the ILD layer 1002, sidewall spacer 130, dielectric layer 700, dielectric layer 1000, sacrificial nanosheet layers 116 and nanosheet channel layers 114, to thereby protect the semiconductor materials of the nanosheet stack structure 110 from being etched during the poly etch process. The etching of the dummy gate electrodes 124 opens the gate structures 120.

Sacrificial nanosheet layers 116 are selectively etched away to release the nanosheet channel layers 114, thereby allowing the opened gate structures 120 to extend into spaces between and adjacent to the nanosheet channel layers 114. In this embodiment, the opened gate structures 120 include the open spaces within the inner region defined by the dielectric layer 700, dielectric layer 1000 and nanosheet channel layers 114.

The sacrificial nanosheet layers 116, e.g., SiGe layers, can be etched away selective to the nanosheet channel layers 114, e.g., Si layers, using a wet etch process, for example. In one embodiment, the SiGe material of the sacrificial nanosheet layers 116 can be selectively etched (with high etch selectivity) using a gas phase HCl (hydrochloric acid) or wet etch solution to laterally etch the SiGe material of the sacrificial nanosheet layers 116 selective to the Si material of the nanosheet channel layers 114. The gas phase HCl (hydrochloric acid) provides high etch selectivity when, for example, the nanosheet channel layers 114 are formed of Si or SiGe with a lower Ge concentration than the SiGe material of the sacrificial nanosheet layers 116.

FIGS. 12A and 12B are schematic views of a semiconductor structure 100 at an intermediate stage of fabrication after the performance of an optional trimming of the nanosheet channel layers 114. FIG. 12A is a schematic cross-sectional side view (Y-Z plane) of the semiconductor structure 100 along section line A-A of FIG. 1C and FIG. 12B is a schematic cross-sectional side view (X-Z plane) of the semiconductor structure 100 along section line B-B of FIG. 1C.

As is known in the art, the use of high-k gate dielectric materials is problematic in that such dielectric materials typically do not interface well with silicon layers. For example, high-k gate dielectric materials do not passivate a silicon surface, which results in a large number of interface traps and charges and other issues which can degrade device performance. In one embodiment, before depositing high-k dielectric material to form the high-k gate dielectric layers, a channel pre-clean process is performed to clean the exposed silicon surfaces of the nanosheet channel layers 114 which may then be followed by a thermal oxidation process to grow the thin interfacial silicon oxide layers (not shown) on the exposed surfaces of the nanosheet channel layers 114 within the open gate structures 120. It is to be understood that the formation of the interfacial silicon oxide layers is an optional step and that in other embodiments of the invention, the high-k dielectric material of the high-k/metal gate (HKMG) structures can be formed on the exposed silicon surfaces of the nanosheet channel layers 114 without initially forming the thin interfacial oxide layers.

In one embodiment, the nanosheet channel layers 114 may also be trimmed to a reduced thickness and also to expose the portions 700-1 and 700-2 of the dielectric layer 700. The trimming process also removes nanosheet layers 114-1, 114-4, and 114-5 which are thinner than the nanosheet layers 114-2, 114-4, 114-6, and 114-7. For example, the initial thickness of nanosheet layers 114-1, 114-4, and 114-5 can be 1.5 nm and the initial thickness of the nanosheet layers 114-2, 114-4, 114-6, and 114-7 can be 10 nm in some embodiments. An etch process targeting 2 nm nanosheet etch can completely remove nanosheet layers 114-1, 114-4, and 114-5, and trim nanosheet layers 114-2, 114-4, 114-6, and 114-7 by 4 nm (2 nm etch from each side of the nanosheet). As a result, the final thickness of the nanosheet layers 114-2, 114-4, 114-6, and 114-7 is 6 nm. The trimming process can be performed by a timed etch of nanosheet material. Alternatively, the nanosheet material (e.g., silicon) can be first converted to oxide by chemical oxidation, plasma oxidation, or thermal oxidation followed by and oxide etch process (e.g., by an HF etch). In other embodiments, the formed oxide is not removed and is instead used as the interfacial layer between the high-k gate dielectric and nanosheet channels.

FIGS. 13A and 13B are schematic views of a semiconductor structure 100 at an intermediate stage of fabrication after the formation of a gate dielectric layer 1300 on the exposed surfaces of the gate structures 120, the formation of a work function metal (WFM) 1302 for the bottom source/drain regions 802, WFM 1304 for the top source/drain regions 804, gate contacts 1306 and sacrificial gate caps 1308. FIG. 13A is a schematic cross-sectional side view (Y-Z plane) of the semiconductor structure 100 along section line A-A of FIG. 1C and FIG. 13B is a schematic cross-sectional side view (X-Z plane) of the semiconductor structure 100 along section line B-B of FIG. 1C.

The gate dielectric layer 1300 comprises, for example, a high-K dielectric layer including, but not necessarily limited to, $HfO_2$ (hafnium oxide), $ZrO_2$ (zirconium dioxide), hafnium zirconium oxide, $Al_2O_3$ (aluminum oxide), and $Ta_2O_5$ (tantalum pentoxide) or other electronic grade (EG) oxide. Examples of high-k materials also include, but are not limited to, metal oxides such as hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. In one embodiment, the dielectric material for the gate dielectric layer is conformally deposited using a highly conformal deposition process, such as ALD. Other deposition methods such as CVD and PVD can be utilized to deposit a highly conformal layer of dielectric material to cover exposed portions of the gate structures 120.

WFM layers 1302 are deposited on the gate dielectric layer 1300 and include but are not necessarily limited to one of pFET materials comprising, for example, titanium nitride (TiN), tantalum nitride (TaN) or ruthenium (Ru), and nFET materials comprising, for example, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN. In some embodiments, WFM layers 1302 may be recessed to a desired height relative to portion 700-2 of dielectric layer 700, e.g., above nanosheet channel layer 114-4 but below nanosheet channel layer 114-5 in the z-direction.

WFM layers 1304 are deposited on the WFM layers 1302 and gate dielectric layer 1300 and include but are not necessarily limited to one of pFET materials comprising, for example, titanium nitride (TiN), tantalum nitride (TaN) or ruthenium (Ru), and nFET materials comprising, for example, TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, TaN.

In illustrative embodiments, WFM layers 1302 and 1304 comprise different types of WFM materials. For example, where bottom source/drain regions 802 are pFET source/drain regions and top source/drain regions 804 are nFET source/drain regions, the WFM layers 1302 may comprise pFET WFM materials while the WFM layers 1304 may comprise nFET WFM materials.

The gate structures 120 further include gate contacts 1306 including, but not necessarily limited to, metals, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof deposited in channels etched into the WFM layer 1304. For example, a lithographic process may be utilized to pattern the WFM layer 1304 and etch the channels for the gate contacts 1306.

Sacrificial gate caps 1308 are formed by depositing a layer of dielectric material such as silicon nitride (SiN), silicon carbon nitride (SiCN), silicon oxynitride (SiON), boron nitride (BN), silicon boron nitride (SiBN), silicon-borocarbonitride (SiBCN), silicon oxycarbonitride (SiOCN), or other similar materials commonly used to form gate capping layers.

The gate dielectric layer 1300, WFM, WFM 1304, gate contacts 1306 and sacrificial gate caps 1308 can be deposited using, for example, CVD, PECVD, RFCVD, PVD, ALD, MLD, MBD, PLD, LSMCD, and/or sputtering, followed by planarization by, for example, CMP.

The fabrication process described above with reference to FIGS. 1A through 13B forms a semiconductor structure comprising stacked pFET and nFET semiconductor devices that have enhanced carrier mobility. For example, in some embodiments, the fabrication process forms the bottom source/drain regions 802 with compressive pFET epitaxy, i.e., the epitaxy in the source/drain regions produces compressive strain to pFET nanosheet channels, and forms the top source/drain regions 804 with tensile nFET epitaxy, i.e., the epitaxy in the source/drain regions produces tensile strain to nFET nanosheet channels, which enhances the carrier mobility in both stacked semiconductor devices of different types. In addition, the bottom and top source/drain regions 802 and 804 are formed in a manner that provides epitaxial growth from both the sides, e.g., via nanosheet channel layers 114, and from the bottom, e.g., from semiconductor substrate 102 via sacrificial epitaxial layer 800-1 in the case of bottom source/drain regions 802 and from bottom source/drain region 802 via sacrificial epitaxial layer 800-2 in the case of top source/drain regions 804, which results in improved quality of epitaxy, enhanced merging and filling of the epitaxy in the source/drain regions. By removing the sacrificial epitaxial layers 800-1 and 800-2, the grown epitaxy can further expand (in pFET case) and shrink (in nFET case) to further enhance the compressive strain (in pFET case) and tensile strain (in nFET case) from the source/drain epitaxy. After removing the sacrificial epitaxial layers 800-1 and 800-2 and after strain enhancement, the sacrificial epitaxial layers 800-1 and 800-2 are replaced with dielectric layer 1000 after formation, the resulting source/drain regions 802 and 804 are electrically isolated not only from each other but also from the semiconductor substrate in an effective manner. In addition, because the sacrificial epitaxial layers 800-1 that was used for epitaxy of the bottom source/drain regions 802 is removed and the exposed space is lined with the dielectric layer 1000, air gaps 1004 are also formed below the bottom source/drain regions 802 in the semiconductor substrate 102 in a self-aligned manner that further enhances the localized isolation of the bottom source/drain regions 802 relative to the semiconductor substrate 102. When formed of the same material, dielectric layers 700 and 1000 also form a uniform liner around and between the bottom source/drain regions 802 and top source/drain regions 804.

Thereafter, any known sequence of processing steps can be performed to complete the fabrication of the semiconductor structure, the details of which are not needed to understand the illustrative embodiments. Briefly, by way of example, middle-of-the-line (MOL) processing can continue to form MOL contacts (e.g., gate contacts, source/drain contacts, etc.). Then, a back-end-of-line (BEOL) process module can be performed to fabricate a BEOL interconnect structure which provides connections to/between the MOL contacts, and other active or passive devices that are formed as part of the front-end-of-line (FEOL) layer.

It is to be understood that the methods discussed herein for fabricating semiconductor structures having bottom isolation and enhanced carrier mobility for both nFET and pFET devices can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings illustrative embodiments provided herein, one of ordinary skill in the art will be able to contemplate other implementations and applications of the techniques of the illustrative embodiments.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

The invention claimed is:

1. A semiconductor structure, comprising:
a first dielectric layer disposed on a semiconductor substrate;
a bottom source/drain region disposed on the first dielectric layer and isolated from the semiconductor substrate by the first dielectric layer;
a second dielectric layer disposed on the bottom source/drain region;
a top source/drain region disposed on the second dielectric layer and isolated from the bottom source/drain region by the second dielectric layer; and
an air gap disposed within the semiconductor substrate and surrounded by the first dielectric layer.

2. The semiconductor structure of claim 1, wherein the bottom source/drain region comprises a compressive pFET epitaxy and the top source/drain region comprises a tensile nFET epitaxy.

3. The semiconductor structure of claim 1, wherein the air gap is disposed below the bottom source/drain region.

4. The semiconductor structure of claim 1, wherein the first dielectric layer and the second dielectric layer are formed together as the same dielectric layer.

5. The semiconductor structure of claim 1, further comprising a nanosheet stack structure comprising a first plurality of layers and a second plurality of layers, wherein the first plurality of layers corresponds to the bottom source/drain region and the second plurality of layers corresponds to the top source/drain region.

6. The semiconductor structure of claim 5, wherein the nanosheet stack structure comprises a first work function metal disposed around the first plurality of layers and a second work function metal disposed around the second plurality of layers.

7. The semiconductor structure of claim 6, wherein the first work function metal comprises a material that corresponds to the bottom source/drain region and the second work function metal comprises a material that corresponds to the top source/drain region.

8. The semiconductor structure of claim 6, wherein the first work function metal is disposed on the second work function metal.

9. A semiconductor structure, comprising:
a first dielectric layer disposed on a semiconductor substrate and encapsulating an air gap in the semiconductor substrate;
a bottom source/drain region disposed on the first dielectric layer above the encapsulated air gap;
a second dielectric layer disposed on the bottom source/drain region; and
a top source/drain region disposed on the second dielectric layer.

10. The semiconductor structure of claim 9, wherein the bottom source/drain region comprises a compressive pFET epitaxy and the top source/drain region comprises a tensile nFET epitaxy.

11. The semiconductor structure of claim 9, wherein the first dielectric layer and the second dielectric layer are formed together as the same dielectric layer.

12. The semiconductor structure of claim 9, further comprising a nanosheet stack structure comprising a first plurality of layers and a second plurality of layers, wherein the first plurality of layers corresponds to the bottom source/drain region and the second plurality of layers corresponds to the top source/drain region.

13. The semiconductor structure of claim 12, wherein the nanosheet stack structure comprises a first work function metal disposed around the first plurality of layers and a second work function metal disposed around the second plurality of layers.

14. The semiconductor structure of claim 13, wherein the first work function metal comprises a material that corresponds to the bottom source/drain region and the second work function metal comprises a material that corresponds to the top source/drain region.

15. The semiconductor structure of claim 13, wherein the first work function metal is disposed on the second work function metal.

16. A method for fabricating a semiconductor structure, comprising:
etching a channel between a pair of gate structures down into a semiconductor substrate of the semiconductor structure;
growing a first sacrificial epitaxial layer in the channel;
growing a bottom source/drain region in the channel on the first sacrificial epitaxial layer;
growing a second sacrificial epitaxial layer in the channel on the bottom source/drain region;
growing a top source/drain region in the channel on the second sacrificial epitaxial layer;
removing the first and second sacrificial epitaxial layers, the removal exposing surfaces of the semiconductor substrate, bottom source/drain region and top source/drain region; and
forming a dielectric layer on the exposed surfaces of the semiconductor substrate, bottom source/drain region and top source/drain region.

17. The method of claim 16, wherein forming the dielectric layer on the exposed surfaces of the semiconductor substrate comprises forming an air gap in the semiconductor structure beneath the bottom source/drain region.

18. The method of claim 16, wherein:
growing a bottom source/drain region comprises growing the bottom source/drain region with a compressive pFET epitaxy; and
growing a top source/drain region comprises growing the top source/drain region with a tensile nFET epitaxy.

19. The method of claim 16, wherein forming the dielectric layer on the exposed surfaces of the bottom source/drain region and top source/drain region comprises forming the dielectric layer such that the top source/drain region is isolated from the bottom source/drain region and the bottom source/drain region is isolated from the semiconductor substrate by the dielectric layer.

20. The semiconductor structure of claim 6, wherein the first work function metal and the second work function metal comprise different materials.

* * * * *